(12) United States Patent
Ma et al.

(10) Patent No.: US 11,510,331 B2
(45) Date of Patent: Nov. 22, 2022

(54) PROFILE-MODELING CABLE CLIP FOR SEALING AIRFLOW IN AN INFORMATION HANDLING SYSTEM (IHS) CHASSIS

(71) Applicant: Dell Products, L.P., Round Rock, TX (US)

(72) Inventors: Liang-Chun Ma, Taoyuan (TW); Ching-Yuan Wang, New Taipei (TW); Hung-Pin Chien, New Taipei (TW)

(73) Assignee: Dell Products, L.P., Round Rock, TX (US)

( * ) Notice: Subject to any disclaimer, the term of this patent is extended or adjusted under 35 U.S.C. 154(b) by 89 days.

(21) Appl. No.: 17/016,440

(22) Filed: Sep. 10, 2020

(65) Prior Publication Data

US 2022/0078938 A1    Mar. 10, 2022

(51) Int. Cl.
| | |
|---|---|
| H05K 7/14 | (2006.01) |
| F16L 3/12 | (2006.01) |
| G06F 1/20 | (2006.01) |

(52) U.S. Cl.
CPC ............ H05K 7/1401 (2013.01); F16L 3/12 (2013.01); G06F 1/206 (2013.01)

(58) Field of Classification Search
CPC .......... H05K 7/1401; G06F 1/206; F16L 3/12
See application file for complete search history.

(56) References Cited

U.S. PATENT DOCUMENTS

| | | | | |
|---|---|---|---|---|
| 4,221,352 A | * | 9/1980 | Caveney | H02G 3/32 248/74.3 |
| 4,457,482 A | * | 7/1984 | Kitagawa | F16L 3/23 248/74.3 |
| 4,635,886 A | * | 1/1987 | Santucci | F16L 3/12 248/74.1 |
| 5,254,808 A | * | 10/1993 | Rodrigues | H02G 15/013 174/660 |
| 5,626,316 A | * | 5/1997 | Smigel | H02G 3/32 248/68.1 |
| 5,813,243 A | * | 9/1998 | Johnson | G06F 1/20 361/678 |
| 5,860,291 A | * | 1/1999 | Johnson | G06F 1/20 361/692 |
| 6,259,033 B1 | * | 7/2001 | Kassulat | H02G 3/088 174/151 |
| 6,632,999 B2 | * | 10/2003 | Sempliner | H02G 3/185 52/27 |
| 6,641,093 B2 | * | 11/2003 | Coudrais | B60R 16/0215 248/68.1 |
| 7,236,359 B2 | * | 6/2007 | Strobel | G06F 1/206 312/236 |
| 7,507,912 B1 | * | 3/2009 | Sempliner | H02G 3/185 174/152 G |

(Continued)

FOREIGN PATENT DOCUMENTS

WO    WO-2004010553 A1 *    1/2004    ......... B60R 16/0215

*Primary Examiner* — Abhishek M Rathod
*Assistant Examiner* — Keith DePew
(74) *Attorney, Agent, or Firm* — Fogarty LLP (57) ABSTRACT

Systems and methods for a profile-modeling cable clip for sealing airflow in an Information Handling System (IHS) chassis. In some embodiments, a profile-modeling cable clip for sealing airflow in an IHS chassis may include a base and a plurality of comb teeth coupled to the base via spring elements, where each of the comb teeth is independently compressible.

18 Claims, 10 Drawing Sheets

(56) References Cited

U.S. PATENT DOCUMENTS

| | | | | |
|---|---|---|---|---|
| RE41,863 E | * | 10/2010 | Sempliner | H02G 3/185 52/27 |
| 8,009,417 B2 | * | 8/2011 | Searby | G06F 1/20 165/121 |
| 8,049,109 B2 | * | 11/2011 | Sempliner | H02G 3/22 174/152 G |
| 8,056,868 B2 | * | 11/2011 | Vander Griend | F16L 3/1075 248/68.1 |
| RE43,175 E | * | 2/2012 | Sempliner | H02G 3/185 52/27 |
| 8,507,798 B2 | * | 8/2013 | Sempliner | H02G 3/185 174/152 G |
| 8,716,602 B2 | * | 5/2014 | Cottuli | H02G 3/185 174/152 G |
| 9,077,167 B2 | * | 7/2015 | Blanchard | H02G 3/0437 |
| 9,866,005 B2 | * | 1/2018 | Feige | H02G 7/08 |
| 9,904,336 B1 | * | 2/2018 | Khan | H05K 7/20172 |
| 10,231,034 B1 | * | 3/2019 | Wu | G06F 1/182 |
| 10,601,212 B2 | * | 3/2020 | Lin | H05K 7/20727 |
| 11,038,333 B2 | * | 6/2021 | Schönfeld | H05K 5/0217 |
| 11,396,959 B2 | * | 7/2022 | Reynolds | H02G 3/263 |
| 2003/0108322 A1 | * | 6/2003 | Douglas | G02B 6/4452 385/136 |
| 2005/0093821 A1 | * | 5/2005 | Massie | G06F 1/206 345/184 |
| 2007/0163108 A1 | * | 7/2007 | Dingfelder | H05K 7/1407 361/801 |
| 2009/0151983 A1 | * | 6/2009 | Sempliner | H02G 3/22 174/153 G |
| 2012/0279779 A1 | * | 11/2012 | Cottuli | H02G 3/185 174/660 |
| 2014/0318648 A1 | * | 10/2014 | Tang | H05K 7/20145 137/565.29 |
| 2015/0325939 A1 | * | 11/2015 | Kim | H01R 4/02 439/700 |
| 2018/0343765 A1 | * | 11/2018 | Lin | H05K 7/20727 |
| 2019/0069438 A1 | * | 2/2019 | Guo | H05K 1/0203 |
| 2020/0313411 A1 | * | 10/2020 | Williams | H02G 3/0456 |
| 2021/0006057 A1 | * | 1/2021 | Sugiyama | H02G 3/30 |
| 2022/0013964 A1 | * | 1/2022 | Meghpara | H01R 13/741 |
| 2022/0065274 A1 | * | 3/2022 | Seki | F16B 2/10 |
| 2022/0215983 A1 | * | 7/2022 | Suzuki | H01B 7/00 |

* cited by examiner

PROFILE-MODELING CABLE CLIP FOR SEALING AIRFLOW IN AN INFORMATION HANDLING SYSTEM (IHS) CHASSIS

FIELD

The present disclosure generally relates to Information Handling Systems (IHSs), and, more particularly, to a profile-modeling cable clip for sealing airflow in an IHS chassis.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes.

Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use, such as financial transaction processing, airline reservations, enterprise data storage, global communications, etc.

In addition, IHSs may include a variety of hardware and software components that may be configured to process, store, and communicate information; and may include one or more computer systems, data storage systems, and/or networking systems.

An IHS is typically housed within a chassis and its components are cooled by internal fans. As the inventors hereof have recognized, power accelerators can induce serious preheat risk to downstream IHS components in the chassis. A conventional solution to providing airflow sealing between different parts of a chassis is to use a sponge around the fan gantry and/or system shroud. As the inventors hereof have also recognized, however, cable counts vary among system configurations (e.g., 3 to 7 cables) and a sponge is not an effective and reliable solution to deal with system configurations having different cable counts because it allows hot airflow recirculation and causes downstream inlet temperatures to rise over specifications. Moreover, a sponge is susceptible to wearing out and to permanent deformation. To address these, and other problems, the inventors hereof have developed a profile-modeling cable clip for sealing airflow in an IHS chassis.

SUMMARY

Systems and methods for a profile-modeling cable clip for sealing airflow in an Information Handling System (IHS) chassis are described. In an illustrative, non-limiting embodiment, a profile-modeling cable clip for sealing airflow in an IHS chassis may include a base and a plurality of comb teeth coupled to the base via spring elements, where each of the comb teeth is independently compressible.

In various implementations, each of the comb teeth may be independently compressible upon contact with one or more cables. The one or more cables may pass through a gantry in the IHS chassis. The contact may be provided, maintained, and/or increased, at least in part, by a latch disposed over the gantry. The base may include at least one fastening element configured to attach to a location in the gantry. The plurality of comb teeth may consist of four comb teeth. The spring elements may include M-shaped springs. The base, the plurality of comb teeth, and the spring elements may include a single piece of plastic material. Moreover, in some cases compressible may include deformable.

In another illustrative, non-limiting embodiment, an IHS may include a gantry in a chassis and a profile-modeling cable clip for sealing airflow through the gantry, where the profile-modeling cable clip includes: a base and a plurality of comb teeth coupled to the base via spring elements, where each of the comb teeth is independently deformable.

In yet another illustrative non-limiting embodiment, a method may include passing a plurality of cables through a gantry in a chassis of an IHS and closing a latch over the gantry, where the latch provides, maintains, or increases an uneven contact between the plurality of cables and a profile-modeling cable clip, where the profile-modeling cable clip includes a plurality of comb teeth coupled to a base via spring elements, and where each of the comb teeth is independently deformable or compressible to reduce airflow through the gantry.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below.

Figure 1:
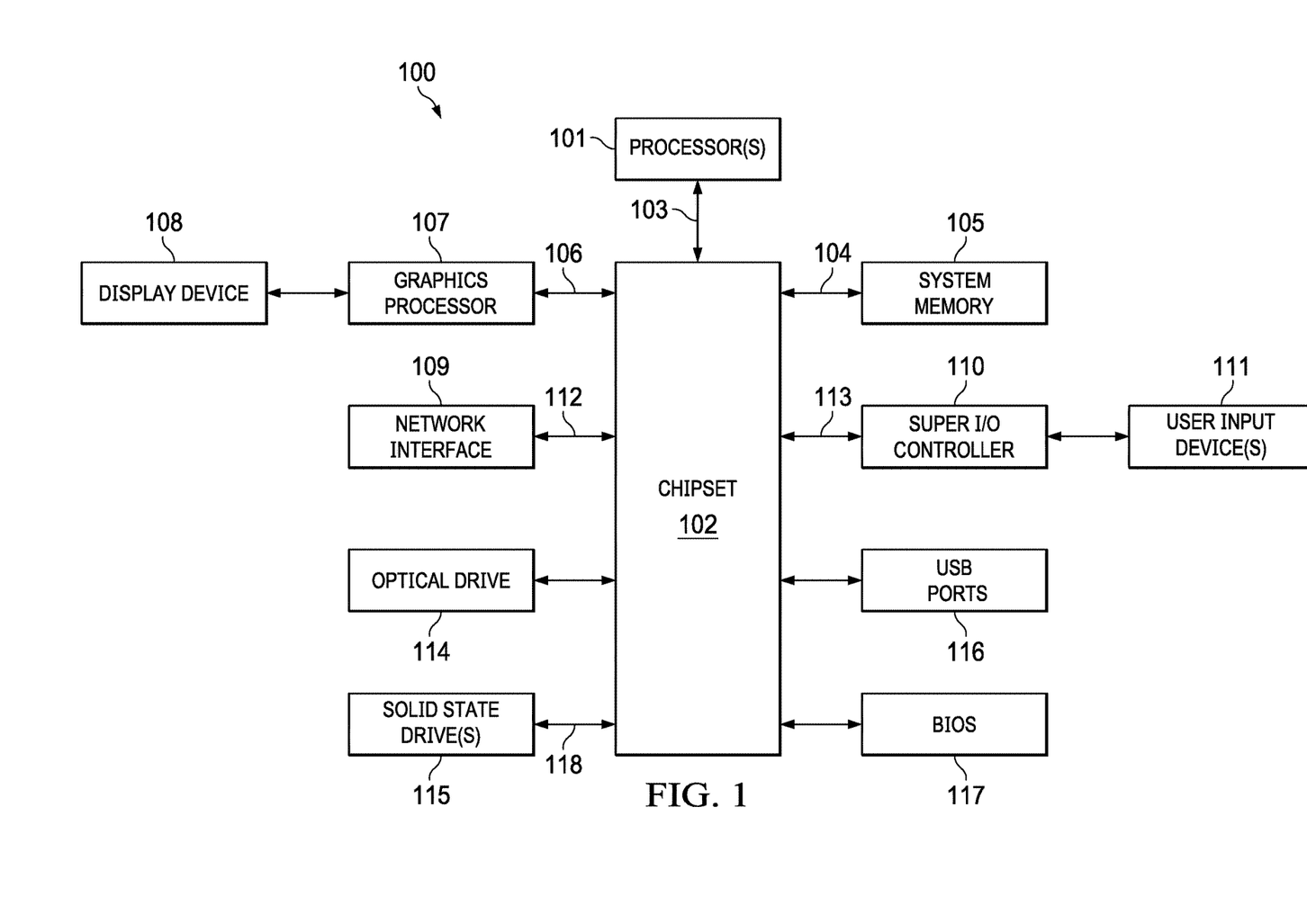
FIG. 1 is a block diagram of an example of components of an Information Handling System (IHS), according to some embodiments.

FIG. 1 is a block diagram of IHS 100 configured according to certain embodiments. IHS 100 may include one or more processors 101. In various embodiments, IHS 100 may be a single-processor system including one processor 101, or a multi-processor system including two or more processors 101. Processor(s) 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

IHS 100 includes chipset 102 that may include one or more integrated circuits that are connect to processor(s) 101. In certain embodiments, chipset 102 may utilize a QPI (QuickPath Interconnect) bus 103 for communicating with the processor(s) 101. Chipset 102 provides the processor(s) 101 with access to a variety of resources. For instance, chipset 102 provides access to system memory 105 over memory bus 104. System memory 105 may be configured to store program instructions and/or data accessible by processors(s) 101. In various embodiments, system memory 105 may be implemented using any suitable memory technology, such as static RAM (SRAM), dynamic RAM (DRAM) or nonvolatile/Flash-type memory.

Chipset 102 may also provide access to a graphics processor 107. In certain embodiments, graphics processor 107 may be comprised within one or more video or graphics cards that have been installed as components of the IHS 100. Graphics processor 107 may be coupled to the chipset 102 via a graphics bus 106 such as provided by an AGP (Accelerated Graphics Port) bus or a PCIe (Peripheral Component Interconnect Express) bus. In certain embodiments, a graphics processor 107 generates display signals and provides them to HMD device 100 (or any other display device 108).

In certain embodiments, chipset 102 may also provide access to one or more user input devices 111. In such embodiments, chipset 102 may be coupled to a super I/O controller 110 that provides interfaces for a variety of user input devices 111, in particular lower bandwidth and low data rate devices. For instance, super I/O controller 110 may provide access to a keyboard and mouse or other peripheral input devices. In certain embodiments, super I/O controller 110 may be used to interface with coupled user input devices 111 such as keypads, biometric scanning devices, and voice or optical recognition devices. The I/O devices, such as may interface super I/O controller 110 through wired or wireless connections. In certain embodiments, chipset 102 may be coupled to the super I/O controller 110 via a Low Pin Count (LPC) bus 113.

Other resources may also be coupled to the processor(s) 101 of the IHS 100 through the chipset 102. In certain embodiments, chipset 102 may be coupled to a network interface 109, such as provided by a Network Interface Controller (NIC) that is coupled to the IHS 100. In certain embodiments, the network interface 109 may be coupled to the chipset 102 via a PCIe bus 112. According to various embodiments, network interface 109 may support communication via various wired and/or wireless networks. In certain embodiments, the chipset 102 may also provide access to one or more Universal Serial Bus (USB) ports 116.

Chipset 102 also provides access to one or more solid state storage devices 115. The chipset 102 utilizes a PCIe bus interface connection 118 in order to communication with the solid-state storage device 115. In certain embodiments, chipset 102 may also provide access to other types of storage devices. For instance, in addition to the solid-state storage device 115, an IHS 100 may also utilize one or more magnetic disk storage devices, or other types of the storage devices such as an optical drive or a removable-media drive. In various embodiments, the solid-state storage device 115 may be integral to the IHS 100, or may be located remotely from the IHS 100.

Another resource that may be accessed by processor(s) 101 via chipset 102 is a BIOS (Basic Input/Output System) 117. As described in more detail below with respect to additional embodiments, upon powering or restarting IHS 100, processor(s) 101 may utilize BIOS 117 instructions to initialize and test hardware components coupled to the IHS 100 and to load an operating system for use by the IHS 100. The BIOS 117 provides an abstraction layer that allows the operating system to interface with certain hardware components that are utilized by IHS 100. Via this hardware abstraction layer provided by BIOS 117, the software executed by the processor(s) 101 of IHS 100 is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

In various embodiments, IHS 100 may not include each of the components shown in FIG. 1. Additionally, or alternatively, IHS 100 may include various components in addition to those that are shown in FIG. 1. Furthermore, some components that are represented as separate components in FIG. 1 may, in some embodiments, be integrated with other components. For example, in various implementations, all or a portion of the functionality provided by the illustrated components may instead be provided by components integrated into the one or more processor(s) 101 as a system-on-a-chip (SOC) or the like.

As such, FIG. 1 shows various internal components of example IHS 100 configured to implement systems and methods described herein. It should be appreciated, however, that although IHS 100 is usually embodied as a laptop or other conventional computing device, other implementations may be utilized with various other types of devices.

Generally, an IHS chassis may house any type of IHS, such as a server, a desktop, etc. In some embodiments, the IHS chassis may include an IHS that is capable of being mounted on a server rack.

Figure 2:
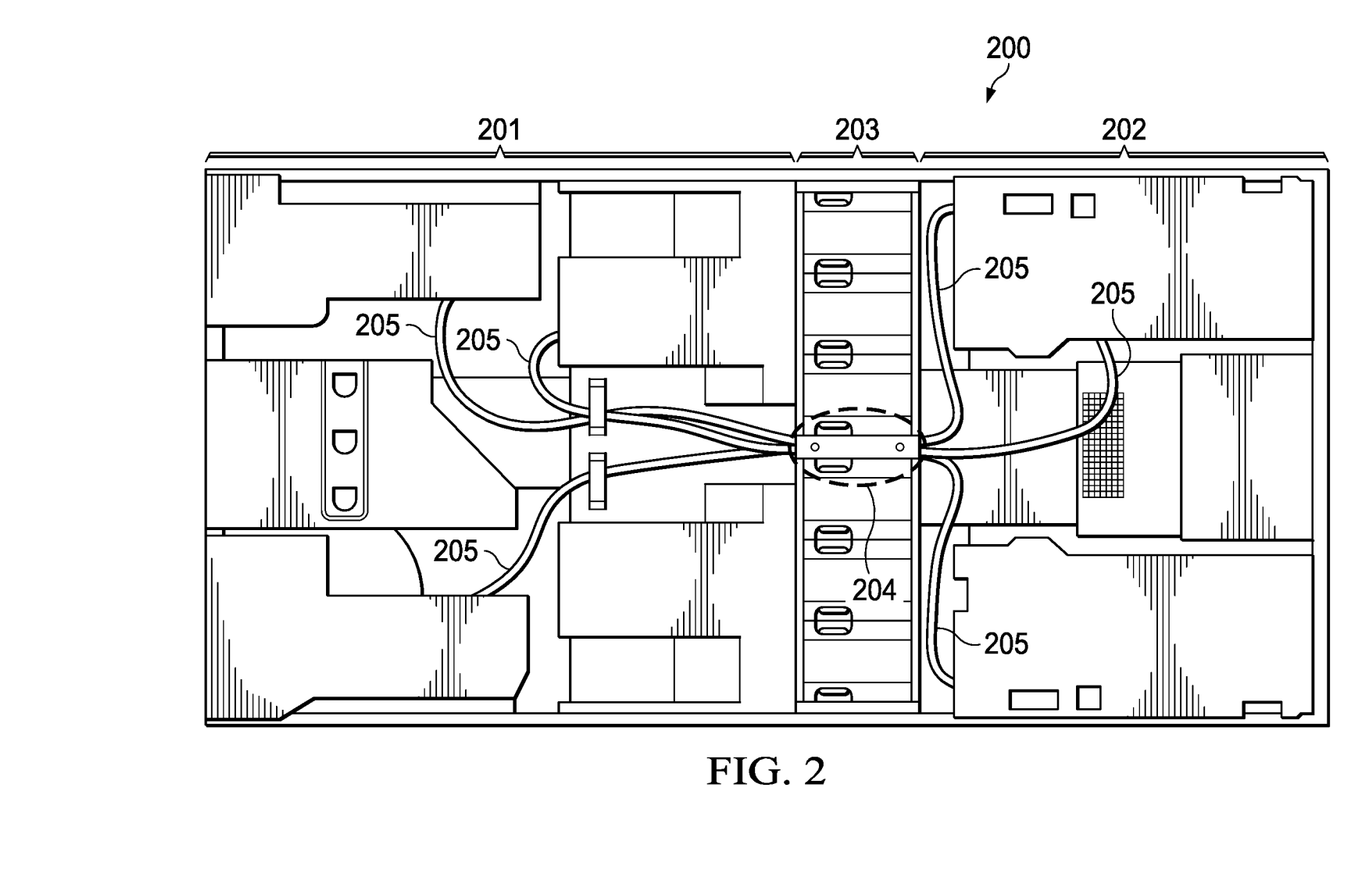
FIG. 2 is a top view of an example of an IHS housed in a chassis, according to some embodiments.

FIG. 2 is a top view of IHS 100 housed in an example of chassis 200 according to some embodiments. Particularly, downstream IHS components 201 (e.g., one or more processors, memories, hard drives, etc.) located in the front-end of chassis 200 are typically mounted on a motherboard, Printed Circuit Board (PCB), or the like, and are physically separated from upstream IHS components 202 (e.g., power supplies) via row or column of fans 203. Fans 203 are assembled and configured to lower the temperature of downstream components 201. Gantry 204 between fans 203 is used to route cables, wires, and/or harnesses 205 between downstream components 201 and upstream components 202.

Figure 3:
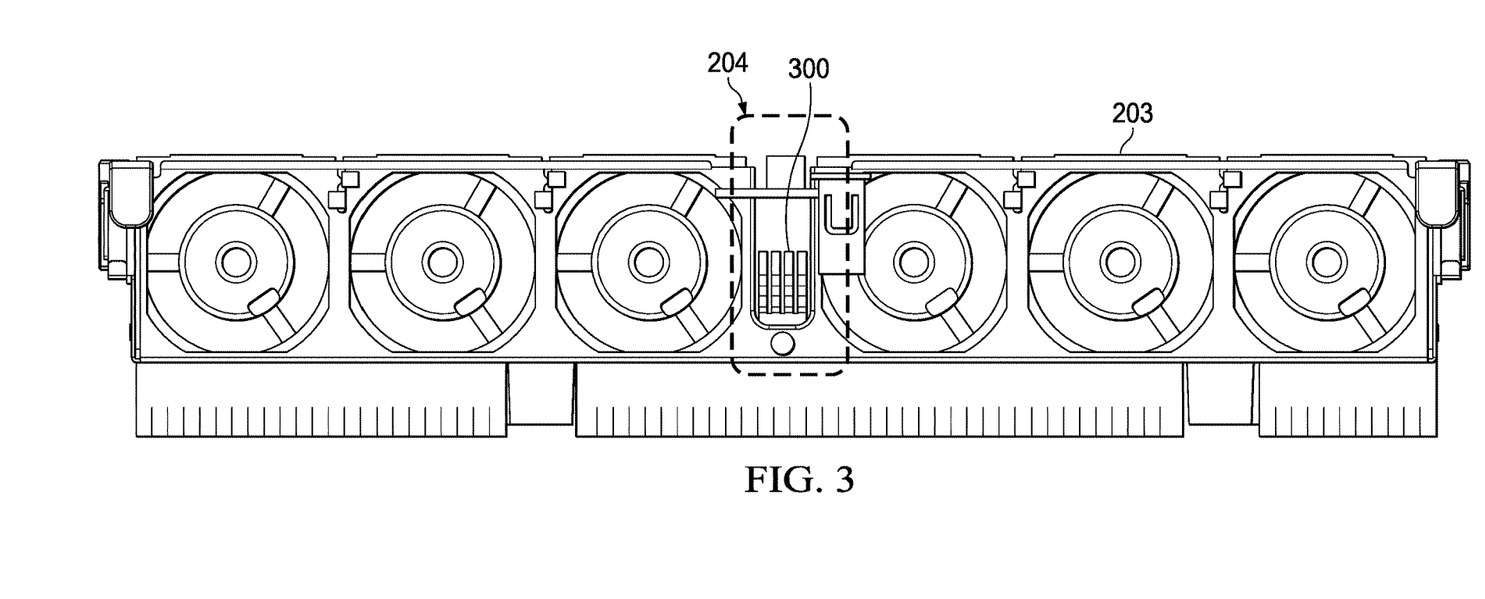
FIG. 3 is a sectional view of an example of a gantry with a profile-modeling cable clip, according to some embodiments.

FIG. 3 is a sectional view of gantry 204 with an example of profile-modeling cable clip 300. In various embodiments discussed in FIGS. 6-9, profile-modeling cable clip 300 is installed in gantry 204 between fans 203 of chassis 200 to seal or reduce airflow through gantry 204. In some cases, cable clip 300 may have profile modeling properties configured to accommodate cables 205 above it by sealing gaps in gantry 204 regardless of the cables' physical configuration—e.g., routed side-by-side or stacked on top of each other. Profile-modeling cable clip 300 may have a comb and spring leg feature, which give it the ability to deform each single tooth individually or all teeth at the same time depending on the force encountered in the presence of different cable counts and routing conditions.

Figure 4A:
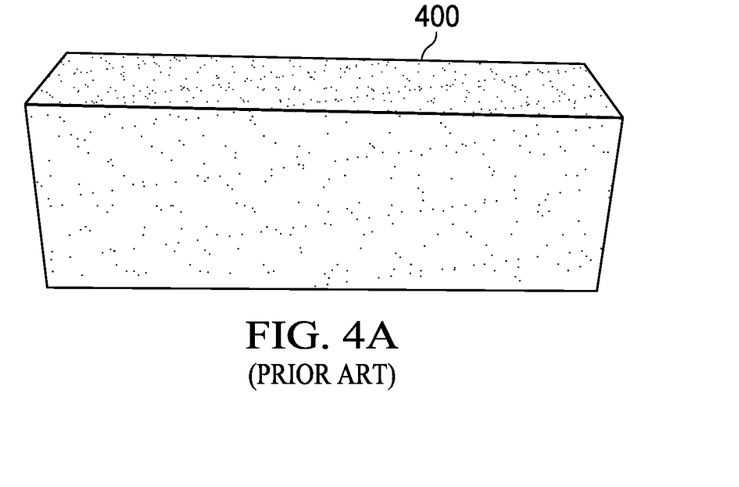
FIGS. 4A and 4B are diagrams of a conventional sponge.
Figure 4B:
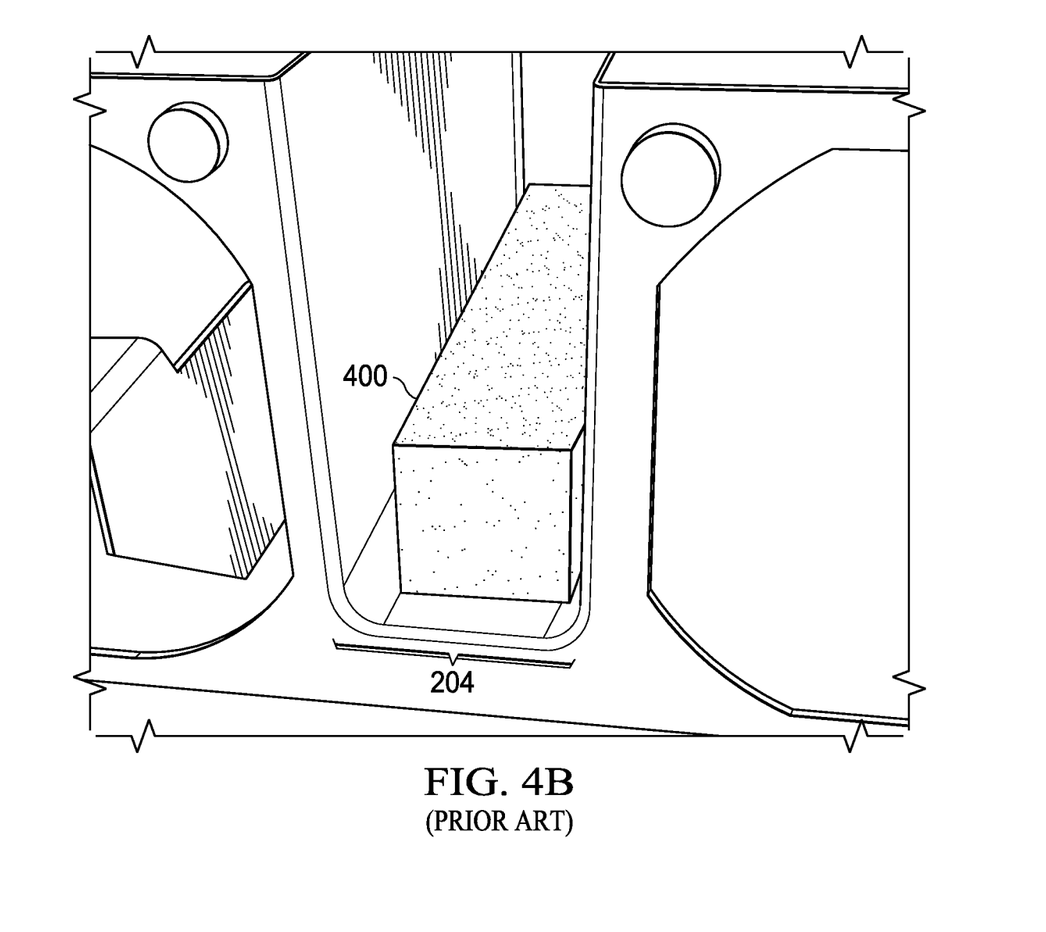
Figure 5A:
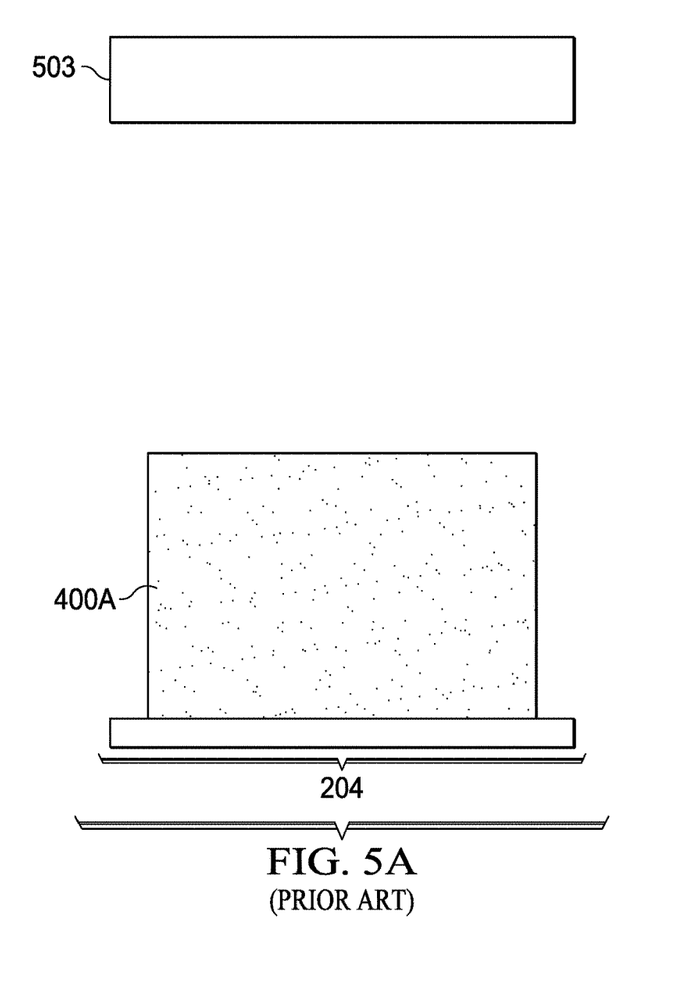
FIGS. 5A and 5B are diagrams of a conventional sponge deployed in a gantry.
Figure 5B:
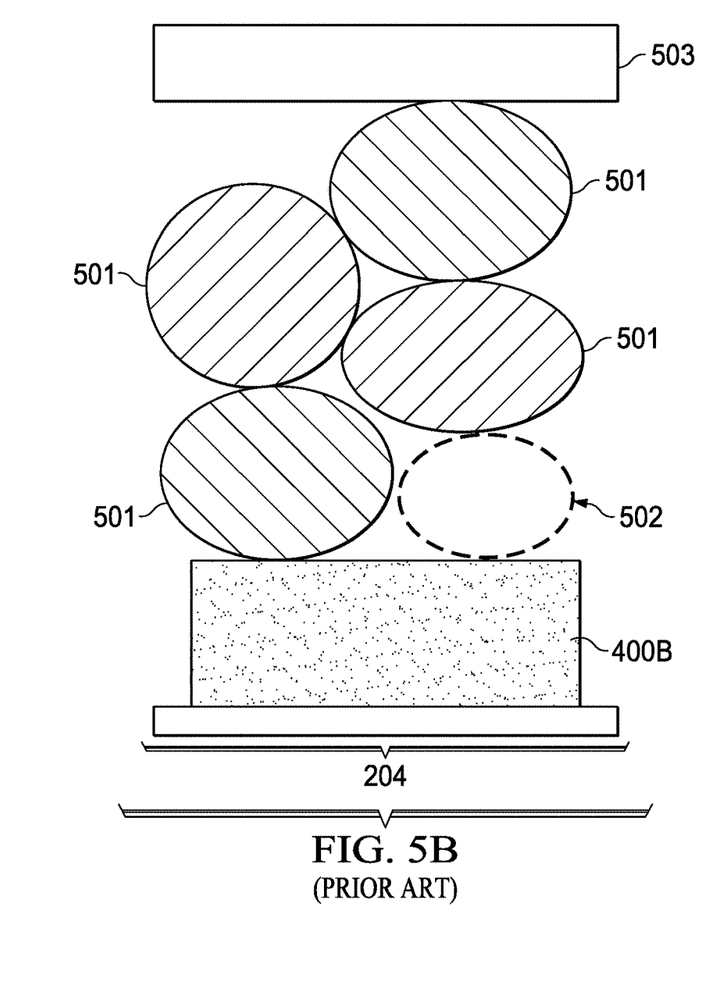

Before describing profile-modeling cable clip 300 further, FIG. 4A shows conventional sponge 400 and FIG. 4B illustrates sponge 400 deployed in gantry 204 of chassis 200. FIG. 5A shows decompressed sponge 400A under latch 503 over gantry 204, and FIG. 5B shows compressed sponge 400B when latch 503 is closed with cables 501 therebetween, thus producing gap 502 (which is detrimental to airflow sealing). Sponge 400 cannot prevent gap 502 from forming due to cables 501 stacking up because the top surface of sponge 400 is deformed entirely (moving downward), thus allowing airflow leakage through gap 502 in gantry 204.

Figure 6A:
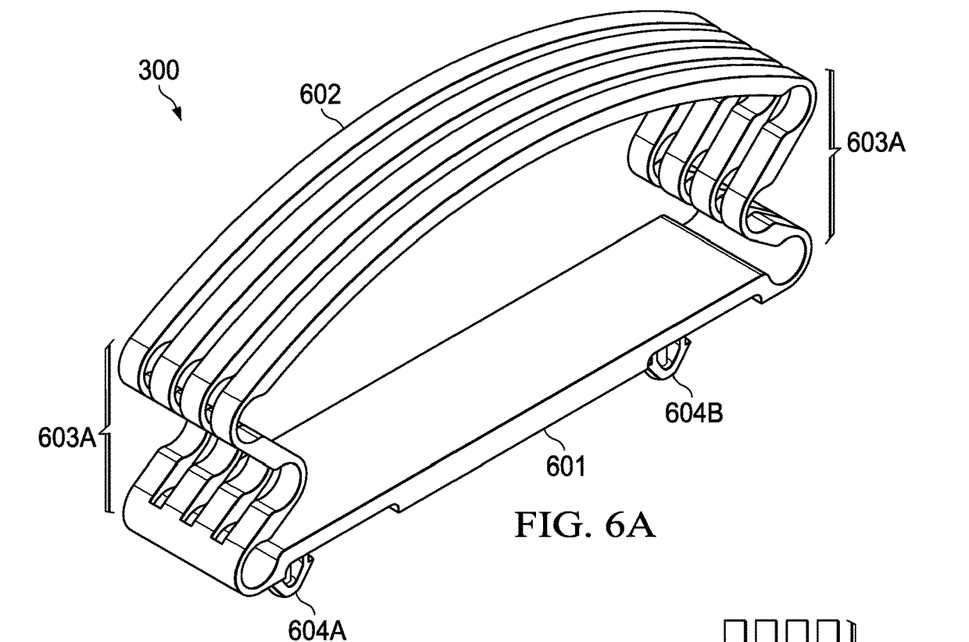
FIGS. 6A-D are diagrams of an example of a profile-modeling cable clip, according to some embodiments.
Figures 6B, 6C:
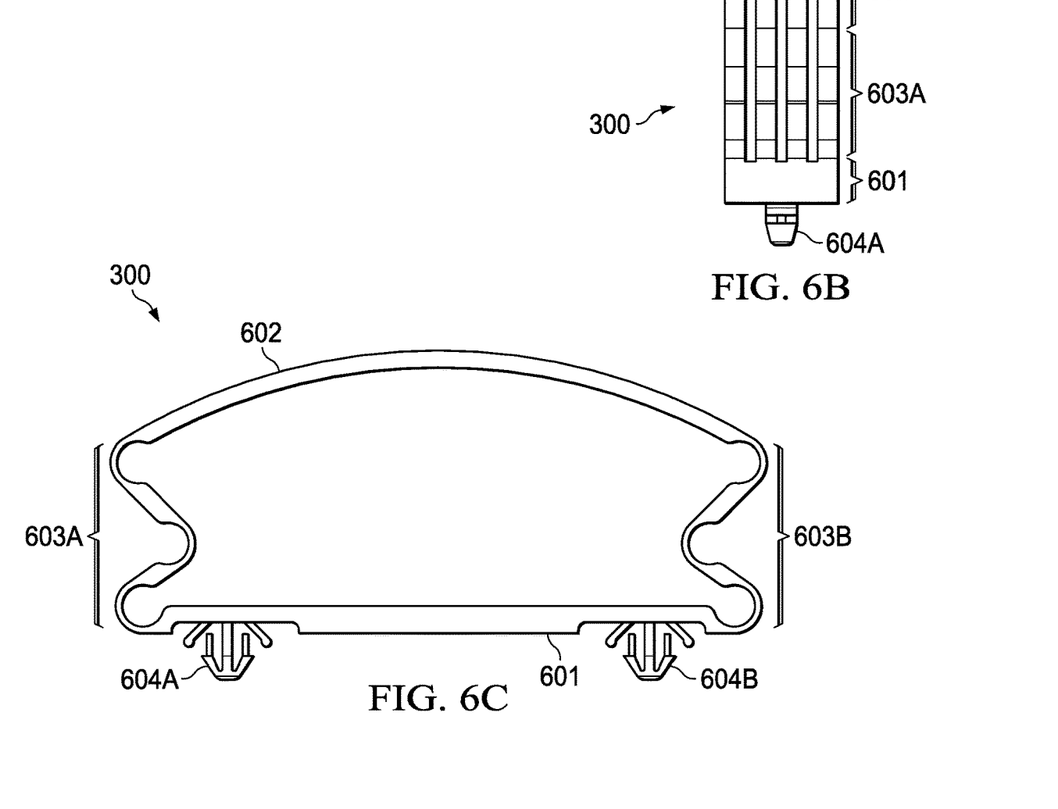

In contrast with conventional sponge 400, FIGS. 6A-C are diagrams of an example of profile-modeling cable clip 300, according to some embodiments. As shown, profile-modeling cable clip includes base 601 coupled to a plurality of comb teeth 602 (e.g., 4 teeth with each set of 2 teeth coupled to a different section of base 601), each comb tooth 602 coupled to base 601 via a corresponding pair of spring elements 603A and 603B. In some cases, spring elements 603A and 603B may be "M-shaped," as shown.

Figure 6D:
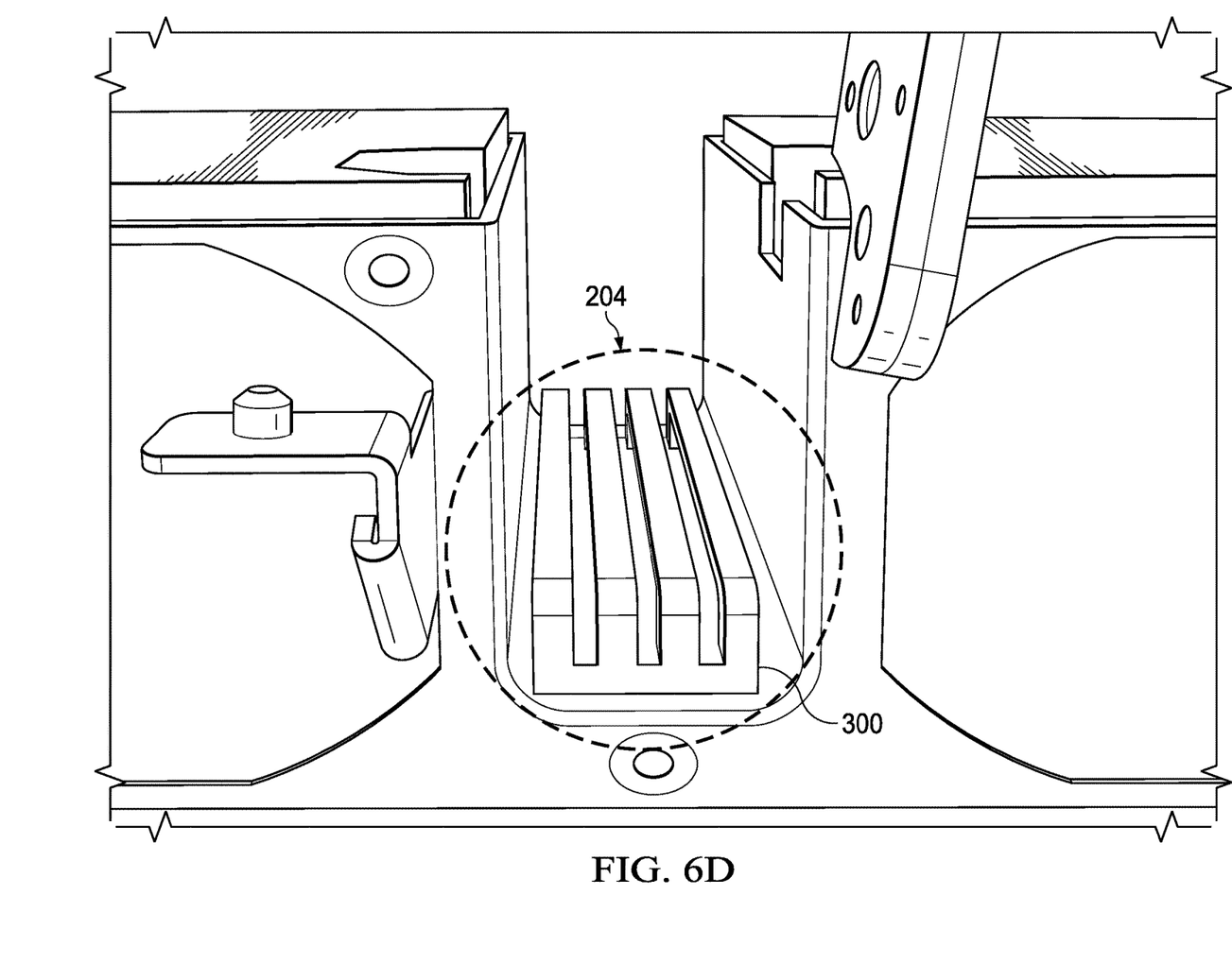

Each pair of opposing spring elements 603A and 603B may enable a given one of comb teeth 602 to be independently compressed and/or deformed. Base 601 also comprises fastening elements 604A and 604B configured to attach to a particular location in gantry 204. In some cases, base 601, comb teeth 602, spring elements 603A and 603B, and/or fastening elements 604A and 604B may be formed of a single piece of plastic material. FIG. 6D illustrates profile-modeling cable clip 300 deployed in gantry 204 of chassis 200.

Figure 7A:
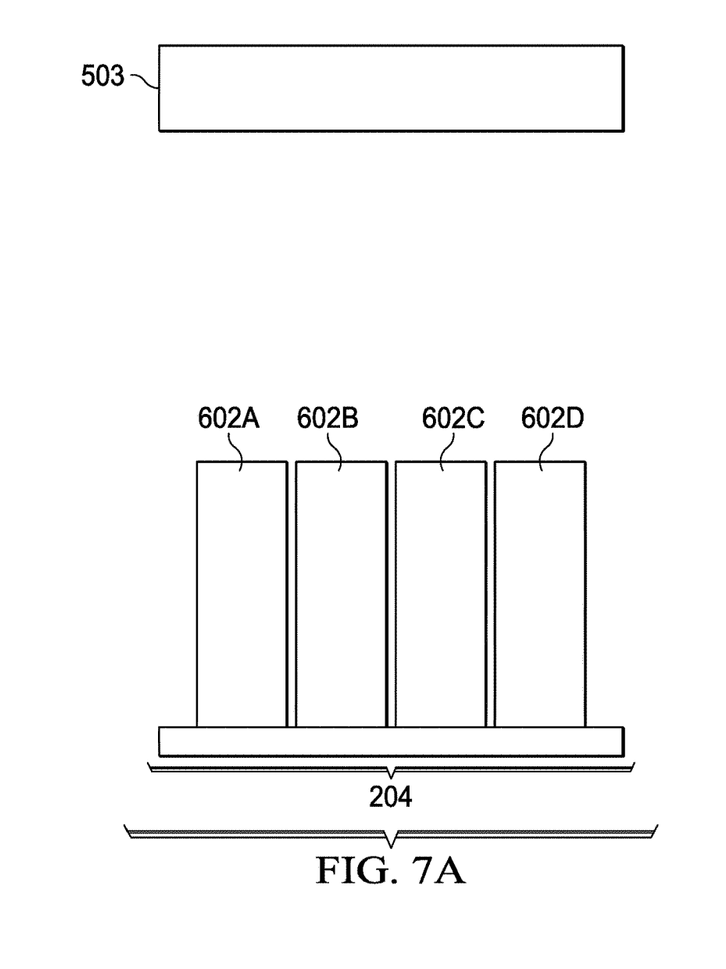
FIGS. 7A and 7B are diagrams of an example of a profile-modeling cable clip deployed in a gantry, according to some embodiments.
Figure 7B:
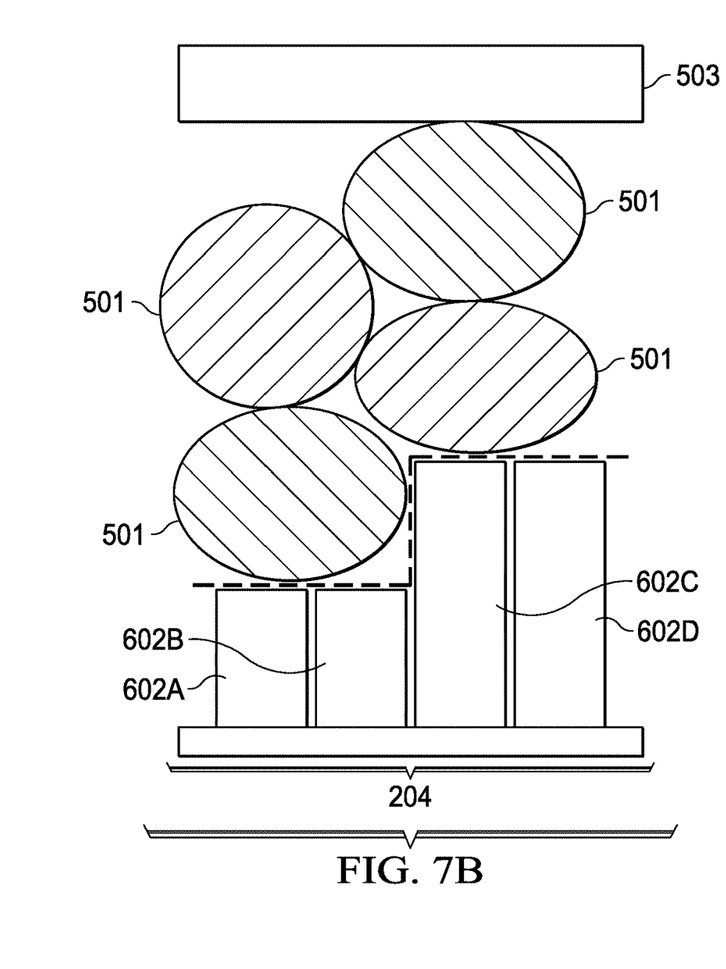

FIGS. 7A and 7B are diagrams of an example of profile-modeling cable clip 300 deployed in gantry 204, according to some embodiments. FIG. 7A shows profile-modeling cable clip 300 under latch 503 over gantry 204 without cables such that comb teeth 602A-D have the same uncompressed height, and FIG. 7B shows profile-modeling cable clip 300 when latch 503 is closed with cables 501 therebetween, such that comb teeth 602A and 602B have a shorter height—that is they are more compressed and/or deformed—than comb teeth 602C and 602D. Cable clip 300 prevents gaps from forming in gantry 204 due to cables 501 stacking up because each of comb teeth 602A-D is independently compressed and/or deformed subject to forces from cables 501 and/or latch 503 thus sealing airflow through gantry 204.

Figure 8A:
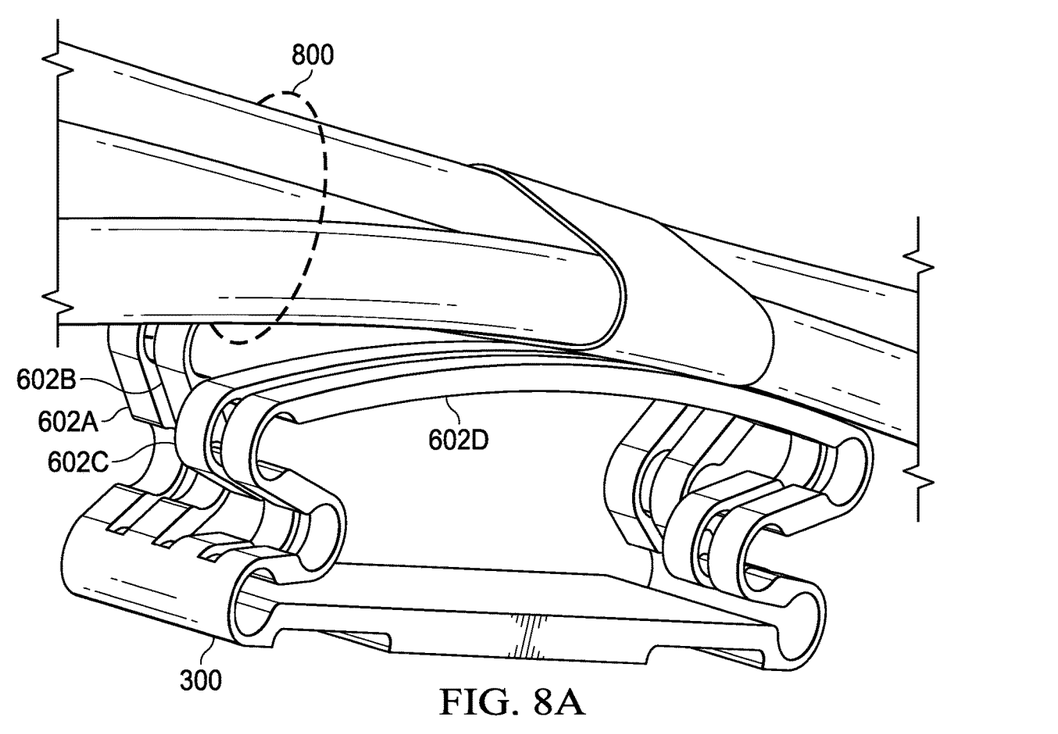
FIGS. 8A and 8B are diagrams of an example of a profile-modeling cable clip with selectively compressed teeth supporting a set of cables, according to some embodiments.
Figure 8B:
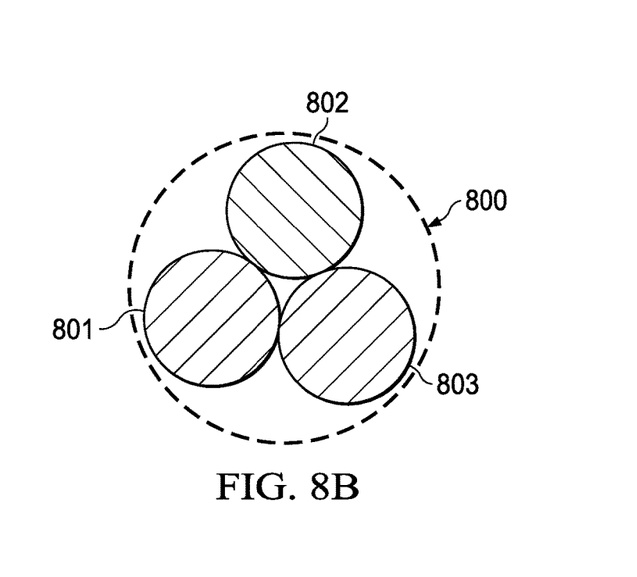

FIGS. 8A and 8B are diagram of an example of profile-modeling cable clip 300 with selectively compressed teeth supporting a set of cables 800, according to some embodiments. Particularly, section view 800 shows cables 801-803 stacked and/or staggered upon each other, such that comb teeth 602A and 602B are less compressed or deformed than comb teeth 602C and 602D.

Figure 9:
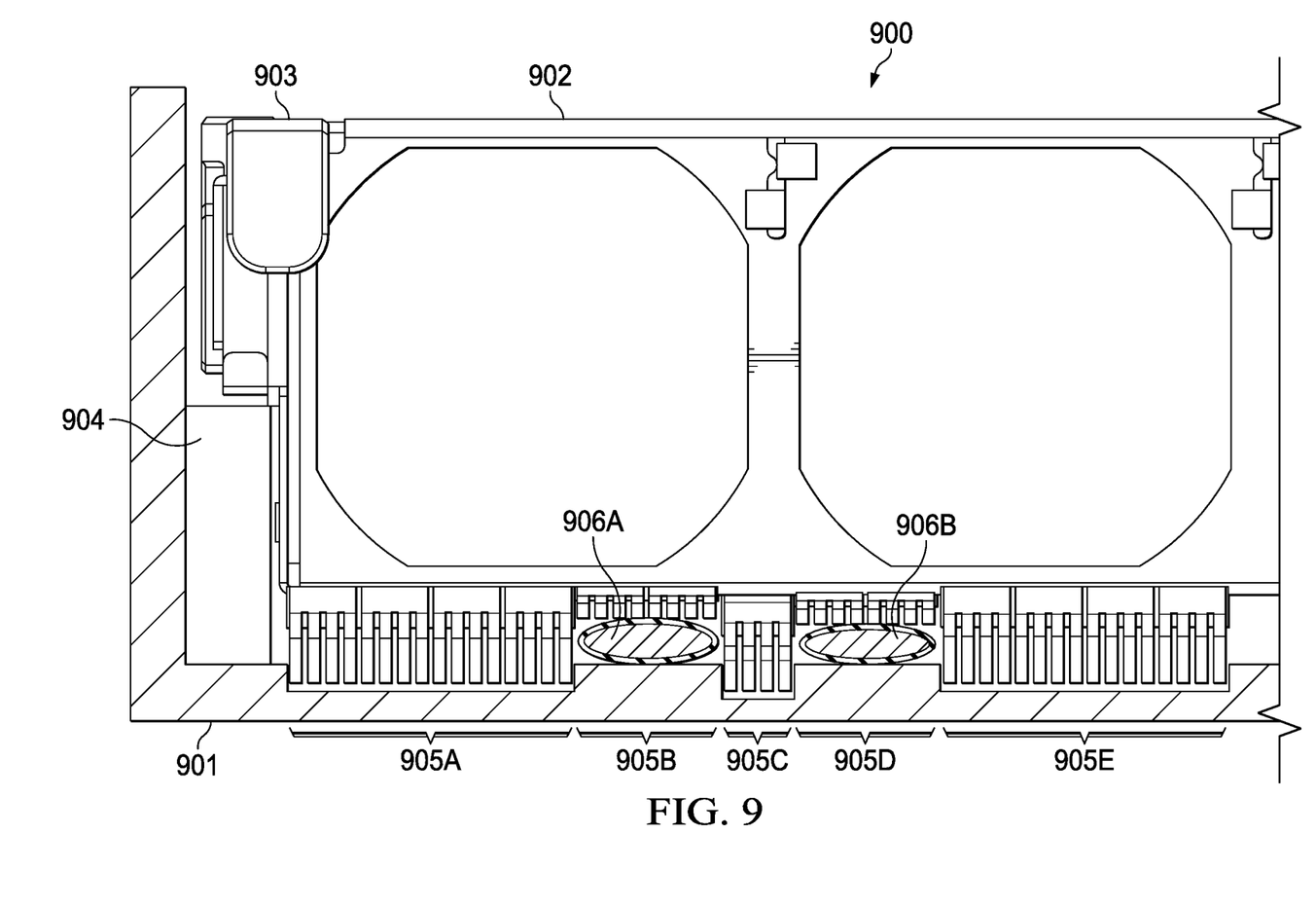
FIG. 9 is a diagram of an example of a set of profile-modeling cable clips in a different size gantry, areas around fan gantry, or areas inside chassis which require airflow sealing, according to some embodiments.

FIG. 9 is a diagram of an example of a set of profile-modeling cable clips 905A-E deployed in a different size gantry, areas around fan gantry, or areas inside chassis which require airflow sealing, according to some embodiments. Particularly, fans or components 902 are coupled to chassis 900 at least in part via latch 903 and cable channel 903 receives cables 906A and 906B. In this configuration, profile-modeling cable clips 905B and 905D are more compressed than profile-modeling cable clips 905A, 905C, and 905E (which are fully extended or decompressed) in response to the presence of cables 906A and 906B. Accordingly, profile-modeling cable clips 905A-E may be used to seal airflow for an opening or channel around a gantry where cables are passing through.

Although various embodiments described herein show profile-modeling cable clips 300 and/or 905A-E having their top surface deformed in response to making contact with cables, it should be noted that the same clips may be used to provide airflow sealing with respect to other components or enclosures. In some implementations, profile-modeling cable clip 300 may maintain a temperature at a PCIe inlet under specifications (e.g., 53.1° C. or 54.5° C.) in contrast with convention sponge 400 (e.g., 55.6° C. or 56.5° C., respectively).

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A profile-modeling cable clip for sealing airflow in an Information Handling System (IHS) chassis, the clip comprising:
   a base; and
   a plurality of comb teeth coupled to the base via spring elements, wherein each of the comb teeth is independently compressible, wherein each of the comb teeth has a shorter height when compressed, and wherein the spring elements comprise M-shaped springs.

2. The profile-modeling cable clip of claim 1, wherein each of the comb teeth is independently compressible upon contact with one or more cables.

3. The profile-modeling cable clip of claim 2, wherein the one or more cables pass through a gantry in the IHS chassis.

4. The profile-modeling cable clip of claim 3, wherein the contact is at least one of: provided, maintained, or increased, at least in part, by a latch disposed over the gantry.

5. The profile-modeling cable clip of claim 4, wherein the base comprises at least one fastening element configured to attach to a location in the gantry.

6. The profile-modeling cable clip of claim 1, wherein the plurality of comb teeth consists of four comb teeth.

7. The profile modeling cable clip of claim 1, wherein the base, the plurality of comb teeth, and the spring elements comprise a single piece of plastic material.

8. The profile-modeling cable clip of claim 1, wherein compressible comprises deformable.

9. An Information Handling System (IHS), comprising:
   a gantry in a chassis; and
   a profile-modeling cable clip for sealing airflow through the gantry, wherein the profile-modeling cable clip comprises:
     a base; and
     a plurality of comb teeth coupled to the base via spring elements, wherein each of the comb teeth is independently deformable, wherein the comb teeth are configured to support one or more cables that are parallel to the comb teeth, and wherein the spring elements comprise M-shaped springs.

10. The IHS of claim 9, wherein each of the comb teeth is independently deformable upon contact with the one or more cables.

11. The IHS of claim 10, wherein the one or more cables pass through the gantry.

12. The IHS of claim 11, wherein the contact is at least one of: provided, maintained, or increased, at least in part, by a latch disposed over the gantry.

13. The IHS of claim 12, wherein the base comprises at least one fastening element configured to attach to a location in the gantry.

14. The IHS of claim 9, wherein the plurality of comb teeth consists of four comb teeth.

15. The IHS of claim 9, wherein the base, the plurality of comb teeth, and the spring elements comprise a single piece of plastic material.

16. The IHS of claim 9, wherein deformable comprises compressible.

17. A method, comprising:
   passing a plurality of cables through a gantry in a chassis of an Information Handling System (IHS); and
   closing a latch over the gantry, wherein the latch provides, maintains, or increases an uneven contact between the plurality of cables and a profile-modeling cable clip, wherein the profile-modeling cable clip comprises a plurality of comb teeth coupled to a base via spring elements, wherein the spring elements comprise M-shaped springs, wherein each of the comb teeth is independently deformable or compressible to reduce airflow through the gantry, wherein each of the comb teeth has a shorter height when deformed or compressed, and wherein the comb teeth are configured to support one or more cables that are parallel to the comb teeth.

18. The method of claim 17, wherein the base, the plurality of comb teeth, and the spring elements comprise a single piece of plastic material.

* * * * *